US011646728B2

(12) United States Patent
Wei et al.

(10) Patent No.: US 11,646,728 B2
(45) Date of Patent: May 9, 2023

(54) CLOCK SIGNAL GENERATION CIRCUIT, METHOD FOR GENERATING CLOCK SIGNAL AND ELECTRONIC DEVICE

(71) Applicants: Beijing BOE Technology Development Co., Ltd., Beijing (CN); BOE Technology Group Co., Ltd., Beijing (CN)

(72) Inventors: Xiangye Wei, Beijing (CN); Liming Xiu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/765,933

(22) PCT Filed: Mar. 9, 2021

(86) PCT No.: PCT/CN2021/079743
§ 371 (c)(1),
(2) Date: Apr. 1, 2022

(87) PCT Pub. No.: WO2021/196993
PCT Pub. Date: Oct. 7, 2021

(65) Prior Publication Data
US 2022/0407507 A1 Dec. 22, 2022

(30) Foreign Application Priority Data
Apr. 3, 2020 (CN) .......................... 202010260304.7

(51) Int. Cl.
*H03K 3/00* (2006.01)
*H03K 5/24* (2006.01)
(Continued)

(52) U.S. Cl.
CPC ............. *H03K 5/249* (2013.01); *H03K 3/011* (2013.01); *H03K 5/26* (2013.01)

(58) Field of Classification Search
CPC ........... H03K 5/249; H03K 3/011; H03K 5/26
(Continued)

(56) References Cited

U.S. PATENT DOCUMENTS 9,582,027 B2 * 2/2017 Coutts ........................ G06F 1/08
9,582,028 B1 * 2/2017 Xiu ............................ G06F 1/10
(Continued)

FOREIGN PATENT DOCUMENTS

CN  101087141 A  12/2007
CN  110581743 A  12/2019
CN  111446962 A   7/2020

*Primary Examiner* — Ryan Jager
(74) *Attorney, Agent, or Firm* — IPro, PLLC

(57) ABSTRACT

A clock signal generation circuit, a method for generating a clock signal, and an electronic device are provided, relating to the field of communications technology. In the clock signal generation circuit, an initial clock providing circuit can generate an initial clock signal having an initial frequency; a control word providing circuit can determine a target frequency offset of the initial frequency based on a detected target parameter and generate a frequency control word based on the target frequency offset; a target clock generating circuit can generate a target clock signal having a target output frequency based on the frequency control word and the initial clock signal, wherein the target output frequency is negatively correlated with a value of the frequency control word and positively correlated with the initial frequency.

20 Claims, 5 Drawing Sheets

(51) Int. Cl.
*H03K 3/011* (2006.01)
*H03K 5/26* (2006.01)

(58) Field of Classification Search
USPC .......................................................... 327/291
See application file for complete search history.

(56) References Cited

U.S. PATENT DOCUMENTS

| | | | | |
|---|---|---|---|---|
| 10,541,696 B2 * | 1/2020 | Xiu | ........................ | H03K 3/00 |
| 10,715,154 B2 * | 7/2020 | Xiu | ........................ | H03L 7/087 |
| 11,139,819 B2 * | 10/2021 | Ma | ............................ | H03L 7/18 |
| 11,429,137 B2 * | 8/2022 | Wei | ........................ | H03K 5/01 |
| 2001/0022524 A1 * | 9/2001 | Kim | ..................... | H03L 7/0818 |
| | | | | 327/161 |
| 2012/0187991 A1 * | 7/2012 | Sathe | .................... | H03K 5/135 |
| | | | | 327/158 |
| 2021/0356985 A1 * | 11/2021 | Wei | ...................... | H03L 7/0995 |
| 2022/0311428 A1 * | 9/2022 | Wei | ..................... | H03K 5/1565 |
| 2022/0311529 A1 * | 9/2022 | Wei | .......................... | H04L 7/00 |
| 2022/0345136 A1 * | 10/2022 | Qi | .......................... | H03L 7/083 |
| 2022/0376687 A1 * | 11/2022 | Wei | ....................... | H03K 3/017 |

\* cited by examiner

CLOCK SIGNAL GENERATION CIRCUIT, METHOD FOR GENERATING CLOCK SIGNAL AND ELECTRONIC DEVICE

CROSS-REFERENCE TO RELATED APPLICATION

The present application is a 371 of PCT Patent Application Serial No. PCT/CN2021/079743, filed on Mar. 9, 2021, which claims priority to Chinese Patent Application No. 202010260304.7, filed on Apr. 3, 2020, and entitled "CLOCK SIGNAL GENERATION CIRCUIT, CLOCK SIGNAL GENERATION METHOD AND ELECTRONIC DEVICE", the entire contents of both of which are incorporated herein by reference.

TECHNICAL FIELD

The present disclosure relates to the field of communications technology, and in particular to a clock signal generation circuit, a method for generating a clock signal, and an electronic device.

BACKGROUND

Clock signals are one kind of the essential signals of an electronic device, and the frequency of the clock signals determines the data processing efficiency of the electronic device, that is, determines a working rate of the electronic device.

In related art, in order to generate a clock signal having a frequency, a clock signal generation circuit disposed in the electronic device usually includes: a frequency source (such as crystal oscillator) that can generate an oscillating frequency.

However, due to the impact of factors about the temperature, the air pressure or the process, the oscillating frequency generated by the frequency source is prone to offset (that is, frequency offset), which may lead to abnormal clock signals.

SUMMARY

The present disclosure provides a clock signal generation circuit, a method for generating a clock signal, and an electronic device. The technical solutions are as follows.

According to an aspect, a clock signal generation circuit is provided. The circuit includes an initial clock providing circuit, a control word providing circuit and a target clock generating circuit;

the initial clock providing circuit is connected to the target clock generating circuit, and the initial clock providing circuit is configured to: generate an initial clock signal having an initial frequency, and output the initial clock signal to the target clock generating circuit;

the control word providing circuit is connected to the target clock generating circuit, and the control word providing circuit is configured to: detect a target parameter affecting a frequency offset of the initial frequency, determine a target frequency offset of the initial frequency based on the target parameter, generate a frequency control word based on the target frequency offset, and output the frequency control word to the target clock generating circuit; and the target clock generating circuit is configured to: generate a target clock signal having a target output frequency based on the frequency control word and the initial clock signal, wherein the target output frequency is negatively correlated with a value of the frequency control word and positively correlated with the initial frequency.

Optionally, the target output frequency fs satisfies: fs=fc/F, wherein fc is the initial frequency and F is the value of the frequency control word;

Optionally, the target parameter includes a temperature, and the control word providing circuit includes a temperature detecting sub-circuit, a frequency offset determining sub-circuit and a control word generating sub-circuit;

the temperature detecting sub-circuit is connected to the frequency offset determining sub-circuit, and the temperature detecting sub-circuit is configured to: detect a target temperature, and output the target temperature to the frequency offset determining sub-circuit;

the frequency offset determining sub-circuit is further connected to the control word generating sub-circuit, and the frequency offset determining sub-circuit is configured to: determine the target frequency offset of the initial frequency based on the target temperature, and output the target frequency offset to the control word generating sub-circuit; and the control word generating sub-circuit is further connected to the target clock generating circuit, and the control word generating sub-circuit is configured to: generate the frequency control word based on the target frequency offset, a historical frequency control word and a reference output frequency, output the frequency control word to the target clock generating circuit, and update the historical frequency control word with the frequency control word, wherein a value of the frequency control word F satisfies: F=F0+Δf/fs', F0 is a value of the historical frequency control word, Δf is the target frequency offset, and fs' is the reference output frequency.

Optionally, the frequency offset determining sub-circuit includes a controller and a memory, and the memory stores a plurality of candidate frequency offsets in a one-to-one correspondence with a plurality of different temperatures; and the controller is respectively connected to the memory and the control word generating sub-circuit, and the controller is configured to: search for a target candidate frequency offset corresponding to the target temperature from the plurality of candidate frequency offsets stored in the memory, determine the target candidate frequency offset as the target frequency offset, and output the target frequency offset to the control word generating sub-circuit.

Optionally, the memory has a plurality of storage areas, each of the storage areas stores one candidate frequency offset, and candidate frequency offsets stored in different storage areas are different; and the controller is configured to: determine an address of a target storage area from the plurality of storage areas based on the target temperature, and acquire the target frequency offset from the target storage area based on the address of the target storage area, wherein the address A1 of the target storage area satisfies: A1=T/r+A0, A0 is a reference address, T is the target temperature, and r is a detection resolution of the temperature detecting sub-circuit.

Optionally, the frequency offset determining sub-circuit is configured to determine a target frequency offset in each detection period based on the target temperature output by the temperature detecting sub-circuit; and the control word generating sub-circuit is further configured to: determine whether the target frequency offset is equal to a historical frequency offset, and generate the frequency control word based on the target frequency offset, the historical frequency control word and the reference output frequency if the target frequency offset is not equal to the historical frequency offset, wherein the historical frequency offset is a target frequency offset determined by the frequency offset determining sub-circuit in a previous detection period.

Optionally, the control word generating sub-circuit includes: a register, a comparator and a control word generating unit;

the register is respectively connected to the frequency offset determining sub-circuit, the comparator and the control word generating unit, and the register is configured to: output the historical frequency offset to the comparator, output the target frequency offset generated by the frequency offset determining sub-circuit to the control word generating unit, and update the historical frequency offset with the target frequency offset;

the comparator is further respectively connected to the frequency offset determining sub-circuit and the control word generating unit, and the comparator is configured to: determine whether the target frequency offset is equal to the historical frequency offset, and output an enable signal to the control word generating unit if the target frequency offset is not equal to the historical frequency offset; and the control word generating unit is further connected to the target clock generating circuit, and the control word generating unit is configured to: generate the frequency control word in response to the enable signal based on the target frequency offset, the historical frequency control word and the reference output frequency, output the frequency control word to the target clock generating circuit, and update the historical frequency control word with the frequency control word.

Optionally, the target clock generating circuit includes a candidate clock generating sub-circuit and a target clock generating sub-circuit;

the candidate clock generating sub-circuit is respectively connected to the initial clock providing circuit and the target clock generating sub-circuit, and the candidate clock generating sub-circuit is configured to: generate a plurality of candidate clock signals based on the initial clock signal output by the initial clock providing circuit, and output the plurality of candidate clock signals to the target clock generating sub-circuit, wherein each of the candidate clock signals has the same period, and a phase difference between any two adjacent candidate clock signals is the same; and the target clock generating sub-circuit is further connected to the control word providing circuit, and the target clock generating sub-circuit is configured to generate the target clock signal having the target output frequency based on the plurality of candidate clock signals and the frequency control word output by the control word providing circuit.

Optionally, the target clock generating sub-circuit includes: an input module, a selection module and an output module;

the input module is connected to the control word providing circuit, and the input module is configured to output a selection control signal to the selection module based on the frequency control word;

the selection module is further respectively connected to the candidate clock generating sub-circuit and the output module, and the selection module is configured to: select a target candidate clock signal from the plurality of candidate clock signals in response to the selection control signal, and output the target candidate clock signal to the output module; and the output module is configured to convert the target candidate clock signal to the target clock signal.

Optionally, the input module includes: a first register, a second register, a third register, a fourth register and two adders; the selection module includes: a first selector, a second selector and a third selector; and the output module includes: a D flip-flop, a first inverter and a second inverter;

each of the two adders is respectively connected to the control word providing circuit and the third register, one of the adders, the first register, the second register and the first selector are sequentially connected, and the other adder, the third register, the fourth register and the second selector are sequentially connected;

each of the first selector and the second selector is further respectively connected to the candidate clock generating sub-circuit and the third selector, and the third selector is further connected to a first input terminal of the D flip-flop; and a second input terminal of the D flip-flop is connected to an output terminal of the first inverter, and an input terminal of the first inverter and an input terminal of the second inverter are both connected to an output terminal of the D flip-flop.

According to another aspect, a method for generating a clock signal is provided. The method includes:

generating, by an initial clock providing circuit, an initial clock signal having an initial frequency, and outputting the initial clock signal to a target clock generating circuit;

detecting, by a control word providing circuit, a target parameter affecting a frequency offset of the initial frequency, determining a target frequency offset of the initial frequency based on the target parameter, generating a frequency control word based on the target frequency offset, and outputting the frequency control word to the target clock generating circuit, wherein the frequency control word is positively correlated with the target frequency offset; and generating, by the target clock generating circuit, a target clock signal having a target output frequency based on the frequency control word and the initial clock signal, wherein the target output frequency is negatively correlated with a value of the frequency control word and positively correlated with the initial frequency.

Optionally, the target parameter includes a temperature; the control word providing circuit includes a temperature detecting sub-circuit, a frequency offset determining sub-circuit and a control word generating sub-circuit; and detecting, by the control word providing circuit, the target parameter affecting the frequency offset of the initial frequency, determining the target frequency offset of the initial frequency based on the target parameter, and generating the frequency control word based on the target frequency offset includes:

detecting, by the temperature detecting sub-circuit, a target temperature, and outputting the target temperature to the frequency offset determining sub-circuit;

determining, by the frequency offset determining sub-circuit, the target frequency offset of the initial frequency based on the target temperature, and outputting the target frequency offset to the control word generating sub-circuit; and generating, by the control word generating sub-circuit, the frequency control word based on the target frequency offset, a historical frequency control word and a reference output frequency, wherein a value of the frequency control word F satisfies: $F = F_0 + \Delta f / f_s'$, $F_0$ is a value of the historical frequency control word, $\Delta f$ is the target frequency offset, and $f_s'$ is the reference output frequency; and the method further includes: updating, by the control word generating sub-circuit, the historical frequency control word with the frequency control word.

Optionally, the frequency offset determining sub-circuit includes a controller and a memory, and the memory stores a plurality of candidate frequency offsets in a one-to-one correspondence with a plurality of different temperatures; and determining, by the frequency offset determining sub-circuit, the target frequency offset of the initial frequency based on the target temperature includes:

searching, by the controller, for a target candidate frequency offset corresponding to the target temperature from the plurality of candidate frequency offsets stored in the memory; and determining, by the controller, the target candidate frequency offset as the target frequency offset.

According to another aspect, an electronic device is provided. The electronic device includes a controlled circuit and the clock signal generation circuit according to the foregoing aspect; and the controlled circuit is connected to the clock signal generation circuit, and the controlled circuit is configured to operate in response to a target clock signal having a target output frequency output by the clock signal generation circuit.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present application, and those of ordinary skill in the art may still derive other drawings from these accompanying drawings without creative efforts.

DETAILED DESCRIPTION

In order to make the objectives, technical solutions and advantages of the present disclosure clearer, implementations of the present disclosure will be further described in detail below in combination with the accompanying drawings.

With the rapid development of communications technology, especially after the advent of the fifth generation mobile networks (5G), higher requirements are imposed on the rate of data processing (including acquisition, transmission, operation and storage) of electronic device. The signal that determines the rate is the clock signal.

In related technologies, a clock signal generation circuit that generates the clock signal usually includes a frequency source to generate an oscillating frequency. However, the oscillating frequency generated by the frequency source is easily offset by the temperature, air pressure, process and other factors. As a result, the frequency of the clock signal generated by the clock signal generation circuit is offset. This may be called frequency offset. With the increase of working time, the impact of frequency offset on the operation of the electronic device is gradually amplified, finally leading to abnormal operation of the electronic device.

An embodiment of the present disclosure provides a clock signal generation circuit. The clock signal generation circuit can compensate a frequency based on factors affecting the frequency offset (that is, the frequency offset of the frequency), such that the frequency of the finally generated clock signal does not offset, or the offset is small. Accordingly, the operation of the electronic device provided in the embodiments of the present disclosure is not prone to abnormalities and has better stability.

Figure 1:
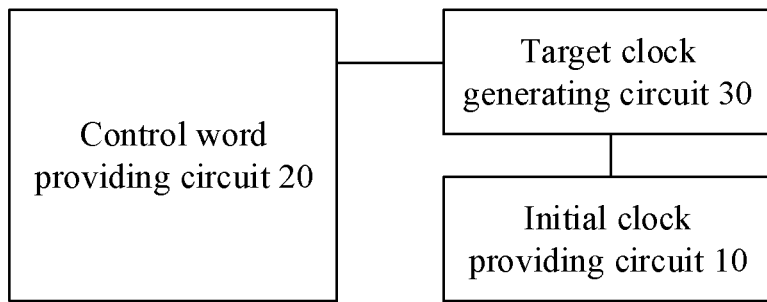
FIG. 1 is a schematic structural diagram of a clock signal generation circuit according to an embodiment of the present disclosure.

FIG. 1 is a schematic structural diagram of a clock signal generation circuit according to an embodiment of the present disclosure. As shown in FIG. 1, the circuit may include an initial clock providing circuit 10, a control word providing circuit 20 and a target clock generating circuit 30.

The initial clock providing circuit 10 may be connected to the target clock generating circuit 30. The initial clock providing circuit 10 may be configured to: generate an initial clock signal having an initial frequency, and output the initial clock signal to the target clock generating circuit 30.

Optionally, the initial clock providing circuit may alternatively be referred to as a frequency source, which may be a crystal oscillator, another oscillation source, or a micro-electro-mechanical system (MEMS).

The control word providing circuit 20 may be connected to the target clock generating circuit 30. The control word providing circuit 20 may be configured to: detect a target parameter affecting a frequency offset of the initial frequency, determine a target frequency offset of the initial frequency based on the target parameter, generate a frequency control word based on the target frequency offset, and output the frequency control word to the target clock generating circuit 30.

Optionally, the target parameters may include: a temperature, an air pressure, and/or a preparation process of the clock signal generation circuit. The temperature may include: an external ambient temperature or a temperature of an electronic device integrated with the clock signal generation circuit.

The target clock generating circuit 30 may be configured to generate a target clock signal having a target output frequency based on the frequency control word and the initial clock signal.

In this embodiment of the present disclosure, the target output frequency may be negatively correlated with a value of the frequency control word and positively correlated with the initial frequency. To be specific, the target output frequency (the frequency of the clock signal finally generated by the clock signal generation circuit) is determined by the initial frequency and the frequency control word, and the initial frequency and the frequency control word have opposite impact on the target output frequency. Accordingly, flexibly generating the frequency control word can reduce the impact of the target parameter on the target output frequency.

Optionally, the control word providing circuit can flexibly generate the frequency control word based on the magnitude of the target frequency offset and the offset of the initial frequency (that is, whether the impact of the target parameter on the initial frequency becomes smaller or larger). In addition, if the offset of the initial frequency becomes smaller, the target frequency offset is larger (that is, the initial frequency offset becomes smaller), and the generated frequency control word should also be smaller. That is, in this offset case, the magnitude of the generated frequency control word may be negatively correlated with the magnitude of the target frequency offset. If the offset of the initial frequency becomes larger, the target frequency offset is larger (that is, the initial frequency offset becomes larger), and the generated frequency control word should also be larger. That is, in this offset case, the magnitude of the generated frequency control word may be positively correlated with the magnitude of the target frequency offset.

In conclusion, this embodiment of the present disclosure provides a clock signal generation circuit. Because the target output frequency of the clock signal finally generated by the clock signal generation circuit is positively correlated with the initial frequency and negatively correlated with a value of the frequency control word, when the initial frequency is affected by the target parameter and frequency offset occurs, the frequency control word may be flexibly generated based on the target frequency offset to achieve reliable compensation for the initial frequency. In this way, the frequency of the finally generated target clock signal is less affected by the target parameter. The clock signal generation circuit generates the clock signal with better reliability.

Optionally, in this embodiment of the present disclosure, the target output frequency fs may satisfy:

$$fs = fc/F \qquad \text{formula (1)}$$

fc is the initial frequency and F is the value of the frequency control word. The clock signal generation circuit is further described in the following embodiment by using an example in which the target parameter includes the temperature.

Figure 2:
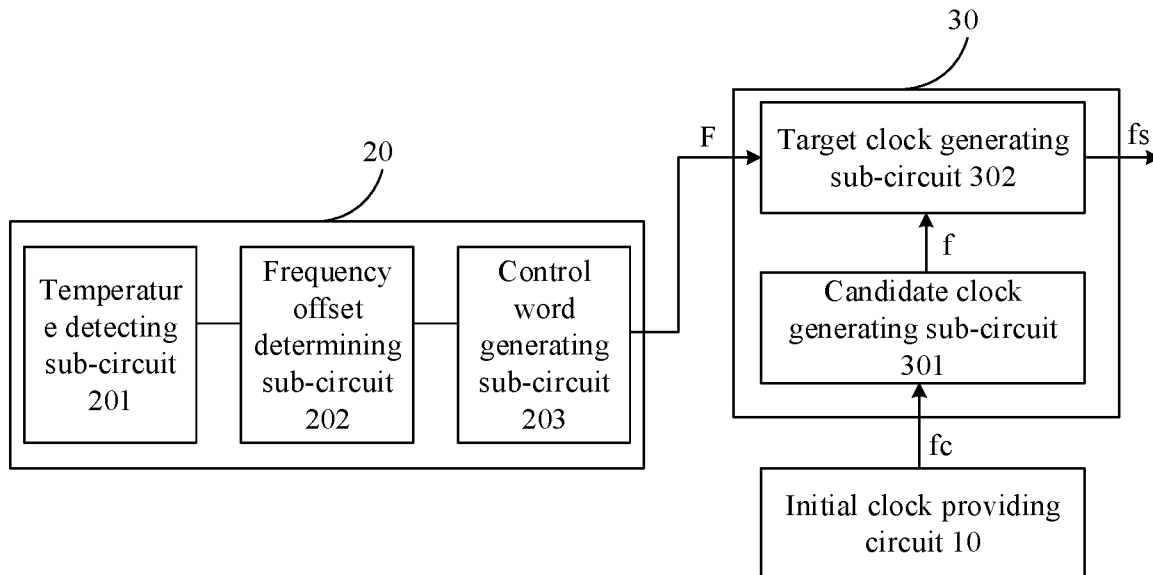
FIG. 2 is a schematic structural diagram of another clock signal generation circuit according to an embodiment of the present disclosure.

FIG. 2 is a schematic structural diagram of another clock signal generation circuit according to an embodiment of the present disclosure. As shown in FIG. 2, the control word providing circuit 20 may include: a temperature detecting sub-circuit 201, a frequency offset determining sub-circuit 202 and a control word generating sub-circuit 203.

The temperature detecting sub-circuit 201 may be connected to the frequency offset determining sub-circuit 202.

The temperature detecting sub-circuit 201 may be configured to: detect a target temperature, and output the target temperature to the frequency offset determining sub-circuit 202.

It should be noted that, to ensure signal transmission reliability, the temperature detecting sub-circuit 201 may not only be configured to detect the current target temperature, but also convert the detected target temperature to an electrical signal (for example, a voltage, a current, or a frequency). That is, in practice, the temperature detecting sub-circuit 201 converts the detected target temperature to an electrical signal for indicating the target temperature, and outputs the electrical signal to the frequency offset determining sub-circuit 202. The frequency offset determining sub-circuit 202 may determine the target temperature based on the received electrical signal. For example, the temperature detecting sub-circuit 201 may include a bipolar junction transistor based sensor, a thermistor sensor, or a crystal temperature sensor.

The frequency offset determining sub-circuit 202 may further be connected to the control word generating sub-circuit 203. The frequency offset determining sub-circuit 202 may be configured to: determine a target frequency offset of the initial frequency based on the target temperature, and output the target frequency offset to the control word generating sub-circuit 203.

Figure 3:
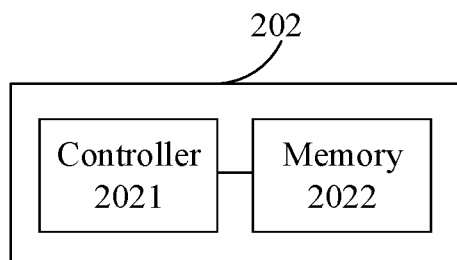
FIG. 3 is a schematic structural diagram of a frequency offset determining sub-circuit according to an embodiment of the present disclosure.

Optionally, FIG. 3 is a schematic structural diagram of the frequency offset determining sub-circuit according to an embodiment of the present disclosure. As shown in FIG. 3, the frequency offset determining sub-circuit 202 may include a controller 2021 and a memory 2022, and the memory 2022 may pre-store a plurality of candidate frequency offsets in a one-to-one correspondence with a plurality of different temperatures.

Referring to FIG. 3, the controller 2021 may be respectively connected to the memory 2022 and the control word generating sub-circuit 203 (not shown in FIG. 3). The controller 2021 may be configured to: search from the plurality of candidate frequency offsets for a target candidate frequency offset corresponding to the target temperature, and determine the target candidate frequency offset as the target frequency offset.

It should be noted that the correspondence between the temperatures and the candidate frequency offsets stored in the memory 2022 may be acquired through a plurality of tests conducted at the factory, and has a certain degree of reliability.

In an optional implementation, the controller 2021 included in the frequency offset determining sub-circuit 202 may traverse the plurality of stored candidate frequency offsets based on the acquired target temperature, to determine the candidate frequency offset corresponding to the target temperature, and determine the candidate frequency offset as the target frequency offset.

Figure 4:
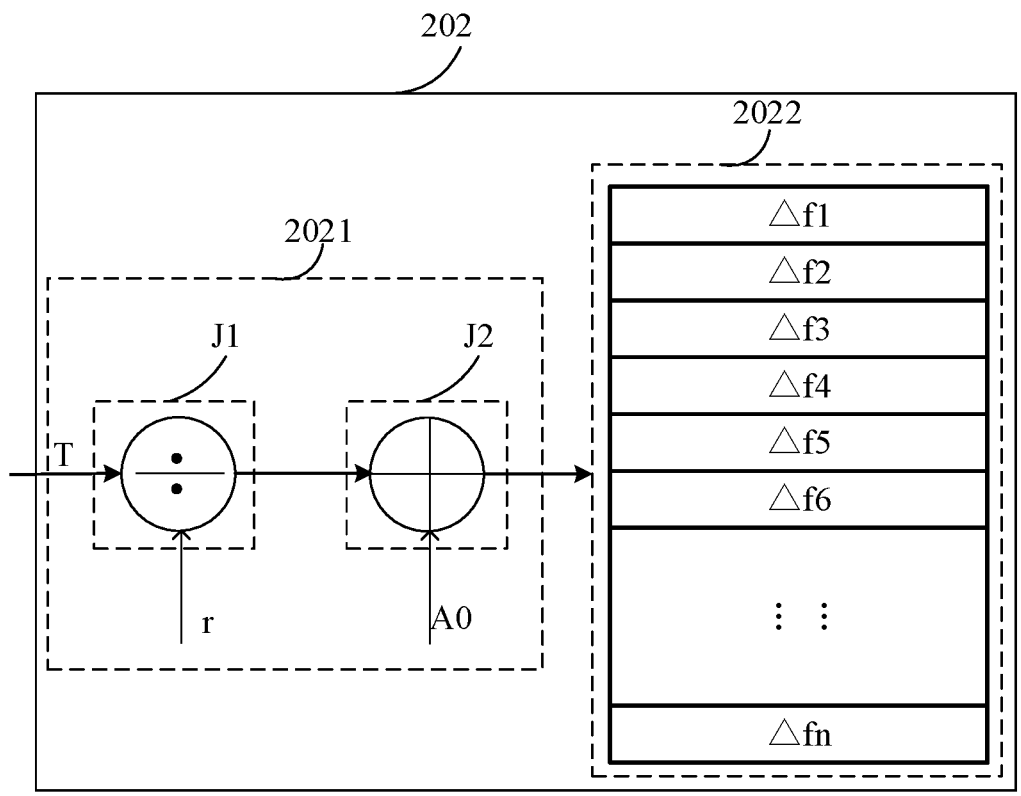
FIG. 4 is a schematic structural diagram of another frequency offset determining sub-circuit according to an embodiment of the present disclosure.

In another optional implementation, the memory 2022 may have a plurality of storage areas, as shown in FIG. 4. Each of the storage areas may store one candidate frequency offset, and the candidate frequency offsets stored in the storage areas may be different. For example, referring to FIG. 4, the memory 2022 shown includes a total of n storage areas which respectively store n candidate frequency offsets $\Delta f$ to $\Delta fn$.

Correspondingly, the controller 2021 included in the frequency offset determining sub-circuit 202 may determine an address of a target storage area from the plurality of storage areas based on the target temperature, and acquire the target frequency offset from the target storage area based on the address of the target storage area. That is, the controller 2021 may first determine, based on the target temperature, the address of the target storage area in which the target frequency offset is stored, and then directly read the target frequency offset from the target storage area.

In this embodiment of the present disclosure, the address A1 of the target storage area may satisfy:

$$A1=T/r+A0 \qquad \text{Formula (2)}$$

A0 is the reference address, T is the target temperature, and r is a detection resolution of the temperature detecting sub-circuit 201. The reference address may be a pre-assigned starting address of the first storage area of the plurality of storage areas. The detection resolution may refer to a minimum temperature change that can be sensed by the temperature detecting sub-circuit 201. For example, if the detection resolution is 0.1 degrees, only when the change of the currently detected target temperature relative to a last detected target temperature is greater than 0.1 degrees, the temperature detecting sub-circuit 201 further converts the currently detected temperature to an electrical signal and output the electrical signal to the frequency offset determining sub-circuit 202 (for example, to the controller 2021 included in the frequency offset determining sub-circuit 202). Moreover, the detection resolution may be preconfigured before delivery in the controller 2021 included in the frequency offset determining sub-circuit 202. Data (that is, DATA A1) stored in the target storage area corresponding to the address of the target storage area is the target frequency offset.

In order to calculate the address of the target storage area based on the formula (2), for example, referring to FIG. 4, the controller 2021 included in the frequency offset determining sub-circuit 202 may further include a divider J1 and an adder J2. After acquiring the target temperature T, the controller 2021 may calculate a ratio T/r of the target temperature T to the detection resolution r through the divider J1, and calculate a sum T/r+A0 of T/r and the reference address A0 through the adder J2, so as to calculate the address of the target storage area in which the target frequency offset is stored, and acquire the target frequency offset ($\Delta f$ shown in FIG. 4) and output the target frequency offset to the control word generating sub-circuit 203. Determining the target frequency offset in this implementation can improve the reliability and efficiency.

Since the frequency offset determining sub-circuit 202 described in the above embodiment determines the target frequency offset through searching based on the target temperature, the frequency offset determining sub-circuit 202 may also be referred to as a frequency-temperature lookup table (f-T lookup table). Certainly, the method for determining the target frequency offset by the frequency offset determining sub-circuit 202 is not limited to the two optional implementations described in the above embodiment. For example, the frequency offset determining sub-circuit 202 (for example, the controller 2021) may have a built-in algorithm for calculating the frequency offset based on the temperature. After acquiring the target temperature, the frequency offset determining sub-circuit 202 may directly substitute the target temperature into the algorithm to calculate the target frequency offset.

Optionally, if the target parameter includes an air pressure, the temperature detecting sub-circuit 201 may be replaced with a sub-circuit capable of detecting the air pressure. Accordingly, the frequency offset determining sub-circuit 202 may determine the target frequency offset based on the detected air pressure. This is not described in detail herein.

Still referring to FIG. 2, the control word generating sub-circuit 203 (which may also be referred to as a control word conversion sub-circuit) may further be connected to a target clock generating circuit 30, and the control word generating sub-circuit 203 may be configured to: generate a frequency control word based on the target frequency offset, a historical frequency control word, and a reference output frequency, output the frequency control word to the target clock generating circuit 30, and update the historical frequency control word with the frequency control word.

Optionally, in this embodiment of the present disclosure, a value of the frequency control word F may satisfy.

$$F=F0+\Delta f/fs' \qquad \text{formula (3)}$$

F0 is a value of the historical frequency control word, $\Delta f$ is the target frequency offset, and fs' is the reference output frequency. The historical frequency control word F0 is a frequency control word received at a target historical moment, and the target historical moment is a historical moment nearest to a current moment of receiving a value of the frequency control word F. The reference output frequency fs' is a frequency of a clock signal generated by the target clock generating circuit 30 based on the initial frequency without frequency offset and an initial frequency control word. The initial frequency control word is a frequency control word configured in the control word generating sub-circuit 203 at the factory or at first operation. That is, the reference output frequency fs' of the clock signal generation circuit is usually fixed.

The ultimate purpose of this embodiment of the present disclosure is to make a frequency (that is, the target output frequency) of a clock signal generated based on the initial frequency with offset be the same as a frequency of a clock signal generated based on the initial frequency without offset (that is, the reference output frequency). Due to large cost of directly adjusting the initial frequency, in this embodiment of the present disclosure, the control word providing circuit 20 is provided, and the frequency control word is flexibly generated based on the frequency offset of the initial frequency, to ensure, with low cost, less impact or even no impact of the target parameter on the frequency of the finally generated clock signal, that is, ensure that the frequency of the finally generated clock signal is not affected by the frequency offset of the initial frequency.

For example, an optional process of generating a value of the frequency control word F is showed by using an example of performing initial adjustment on the initial frequency control word, that is, an example in which a history control word F0 is the initial frequency control word. Assuming that the target frequency offset is $\Delta f$, if the frequency control word is not adjusted, that is, the frequency is not adjusted, the frequency fs" of the finally generated clock signal satisfies:

$$fs''=(fc+\Delta f)/F0 \qquad \text{formula (4)}$$

In order to ensure that the frequency of the finally generated clock signal is not affected by the frequency offset of the initial frequency, it is necessary to ensure fs"=fs'. Assuming that fs' satisfies the above formula (1), it can be derived that fc satisfies:

$$fc=F0*fs'$$

fc is substituted into the above formula (4), and it can be derived that:

$fs''=fs'=(F0*fs'+\Delta f)/F$

A value of the frequency control word F can be acquired by calculation, satisfying:

F=F0+Δf/fs', that is, the above formula (3) is acquired.

Optionally, in this embodiment of the present disclosure, the frequency offset determining sub-circuit 202 may be configured to determine a target frequency offset in each detection period based on the target temperature output by the temperature detecting sub-circuit 201. The detection period may be pre-configured when the frequency offset determining sub-circuit 202 is delivered, or may be subsequently entered by the user in real time based on the current change of the target parameter. This is not limited in this embodiment of the present disclosure. In addition, the temperature detecting sub-circuit 201 may detect the temperature in real time, or detect the temperature in each detection period.

Accordingly, the control word generating sub-circuit 203 may further be configured to: determine whether the target frequency offset is equal to the historical frequency offset; and generate the frequency control word based on the target frequency offset, the historical frequency control word, and the reference output frequency if the target frequency offset is not equal to the historical frequency offset. The historical frequency offset is the target frequency offset determined by the frequency offset determining sub-circuit 202 in a previous detection period. That is, the control word generating sub-circuit 203 may first determine whether the currently acquired target frequency offset has changed relative to a most recently acquired target frequency offset, and if yes, further generate the frequency control word based on the target frequency offset. Through this design, the power consumption can be effectively reduced, and wrong results caused by constantly generating the frequency control word based on the target frequency offset can be avoided.

Figure 5:
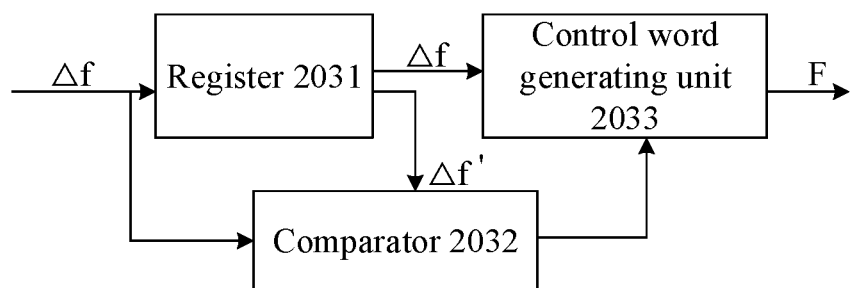
FIG. 5 is a schematic structural diagram of a control word generating sub-circuit according to an embodiment of the present disclosure.

For example, FIG. 5 is a schematic structural diagram of the control word generating sub-circuit 203 according to an embodiment of the present disclosure. As shown in FIG. 5, the control word generating sub-circuit 203 may include a register 2031, a comparator 2032 and a control word generating unit 2033.

The register 2031 may be respectively connected to the frequency offset determining sub-circuit 202 (not shown in FIG. 5), the comparator 2032, and the control word generating unit 2033. The register 2031 may be configured to: output the historical frequency offset (Δf' shown in FIG. 5) to the comparator 2032, output to the control word generating unit 2033 the target frequency offset (Δf shown in FIG. 5) input by the frequency offset determining sub-circuit 202, and update the historical frequency offset with the target frequency offset (Δf shown in FIG. 5).

The comparator 2032 may further be respectively connected to the frequency offset determining sub-circuit 202 (not shown in FIG. 5) and the control word generating unit 2033. The comparator 2032 may be configured to: determine whether the target frequency offset is equal to the historical frequency offset; and if not, output an enable signal to the control word generating unit 2033; or if yes, output a disable signal to the control word generating unit 2033. The disable signal may be used to instruct the control word generating unit 2033 to stop outputting the frequency control word to the target clock generating circuit, or may be used to instruct the control word generating unit 2033 to not generate the frequency control word, that is, to control the control word generating unit 2033 to stop working.

The control word generating unit 2033 may further be connected to the target clock generating circuit 30 (not shown in FIG. 5). The control word generating unit 2033 may be configured to: generate the frequency control word (F shown in FIG. 5) in response to the enable signal based on the target frequency offset, the historical frequency control word and the reference output frequency, output the frequency control word to the target clock generating circuit 30, and update the historical frequency control word with the frequency control word.

It should be noted that the comparator 2032 may be only connected to the register 2031 and the control word generating unit 2033, and the register 2031 may further be configured to output the target frequency offset to the comparator 2032, that is, the register 2031 outputs the target frequency offset and the historical frequency offset to the comparator 2032 simultaneously. Alternatively, the register 2031 may only be connected to the comparator 2032, and the comparator 2032 may output the enable signal and the target frequency offset to the control word generating unit 2033 when determining that the target frequency offset is not equal to the historical frequency offset. Alternatively, the register 2031 may be only connected to the comparator 2032, the control word generating unit 2033 is further connected to the frequency offset determining sub-circuit 202, and the control word generating unit 2033 may directly receive the target frequency offset input by the frequency offset determining sub-circuit 202.

Figure 6:
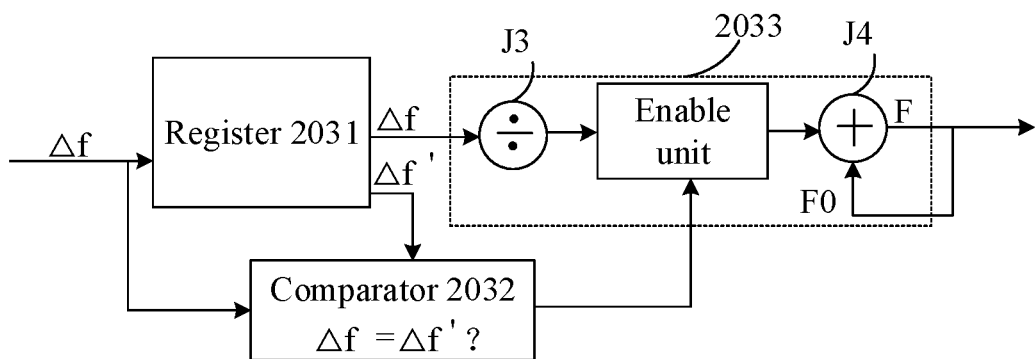
FIG. 6 is a schematic structural diagram of another control word generating sub-circuit according to an embodiment of the present disclosure.

The control word generating sub-circuit shown in FIG. 5 is used as an example, and FIG. 6 is a schematic structural diagram of another control word generating sub-circuit 203 according to an embodiment of the present disclosure. Referring to FIG. 6, the control word generating unit 2033 may include a divider J3, an adder J4 and an enable unit. The comparator 2032 may be connected to the enable unit, and the comparator 2032 may output an enable signal to the enable unit when determining that the target frequency offset is not equal to the historical frequency offset, so as to control the enable unit to connect the divider J3 to the adder J4. Correspondingly, the control word generating unit 2033 may generate a value of the frequency control word F based on the target frequency offset Δf, the historical frequency control word F0, the reference output frequency fs' and the above formula (3) through the divider J3 and the adder J4.

It should be noted that, as described above, the frequency offset determining sub-circuit 202 and the control word generating sub-circuit 203 included in the control word providing circuit 20 may be composed of hardware, that is, may be hardware circuits; or may be virtual circuits (for example, processing chips) configured with code programs. This is not limited in the embodiments of the present disclosure.

Still referring to FIG. 2, the target clock generating circuit 30 provided in this embodiment of the present disclosure may include a candidate clock generating sub-circuit 301 and a target clock generating sub-circuit 302.

The candidate clock generating sub-circuit 301 may be respectively connected to the initial clock providing circuit 10 and the target clock generating sub-circuit 302. The candidate clock generating sub-circuit 301 may be configured to: generate a plurality of candidate clock signals based on the initial clock signal output by the initial clock providing circuit 10, and output the plurality of candidate clock signals to the target clock generating sub-circuit 302, wherein each of the candidate clock signals has the same period and frequency, and a phase difference between any two adjacent candidate clock signals is the same.

Figure 7:
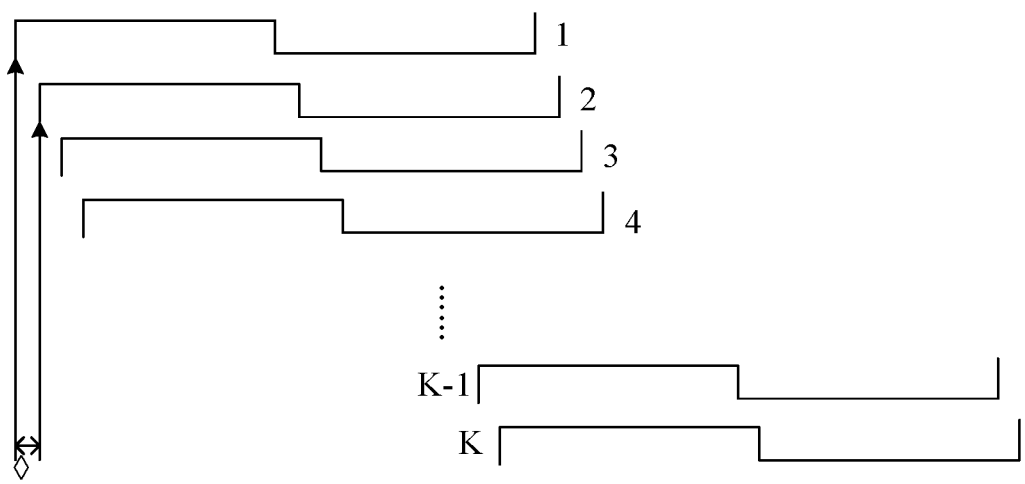
FIG. 7 is a schematic diagram of candidate clock signals generated by a candidate clock generating sub-circuit according to an embodiment of the present disclosure.

For example, the candidate clock generating sub-circuit 301 generates a total of K candidate clock signals. FIG. 7 is a schematic diagram of the candidate clock signals. With reference to FIG. 7, the phase difference Δ between any two adjacent candidate clock signals may satisfy:

$$A=1/K*f \qquad \text{formula (5)}$$

K is a quantity of the candidate clock signals, and f is a frequency of each of the candidate clock signals. Correspondingly, the candidate clock generating sub-circuit 301 may also be referred to as a K-inputs circuit.

Optionally, the quantity K of the candidate clock signals that can be generated by the candidate clock generating sub-circuit 301 may be pre-configured in the circuit, for example, may be set in the circuit by a user (for example, a developer) during production. Further, K may be 2 to the $i^{th}$ power, and i may be an integer greater than or equal to 1. For example, K may be 16, 32, 128, or the like.

The target clock generating sub-circuit 302 may further be connected to the control word providing circuit 20, and the target clock generating sub-circuit 302 may be configured to generate the target clock signal having the target output frequency based on the plurality of candidate clock signals and the frequency control word output by the control word providing circuit 20. The target clock generating sub-circuit 302 shown in FIG. 2 is connected to the control word generating sub-circuit 203 that is in the control word providing circuit 20 and that finally generates a value of the frequency control word F.

Figure 8:
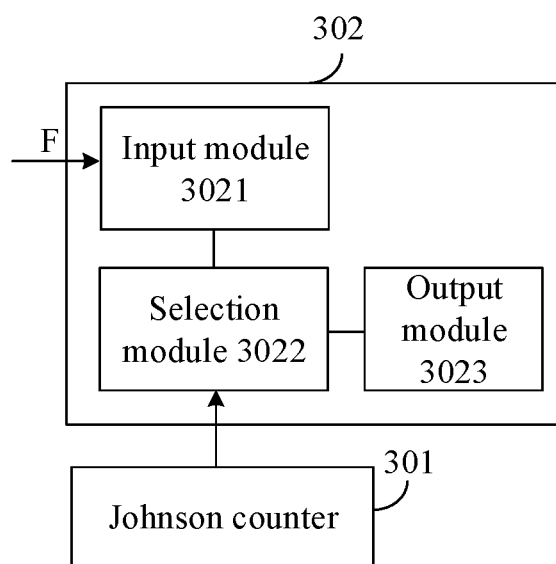
FIG. 8 is a schematic structural diagram of a target clock generating circuit according to an embodiment of the present disclosure.

FIG. 8 is a schematic structural diagram of sub-circuits in the target clock generating circuit 30 according to an embodiment of the present disclosure. As shown in FIG. 8, the candidate clock generating sub-circuit 301 may include a Johnson counter. Because the Johnson counter can generate a larger number of candidate clock signals, and a resolution of a duty cycle of the clock signal is the reciprocal of the quantity of the candidate clock signals, the resolution can be increased and the accuracy can be improved.

Still referring to FIG. 8, the target clock generating sub-circuit 302 may include an input module 3021, a selection module 3022 and an output module 3023.

The input module 3021 may be connected to the control word providing circuit 20 (not shown in FIG. 8), and the input module 3021 may be configured to output a selection control signal to the selection module 3022 based on the frequency control word (F shown in FIG. 8).

The selection module 3022 may further be respectively connected to the candidate clock generating sub-circuit 301 and the output module 3023, and the selection module 3022 may be configured to: select a target candidate clock signal from the plurality of candidate clock signals in response to the selection control signal, and output the target candidate clock signal to the output module 3023.

The output module 3023 may be configured to convert the target candidate clock signal to the target clock signal.

Figure 9:
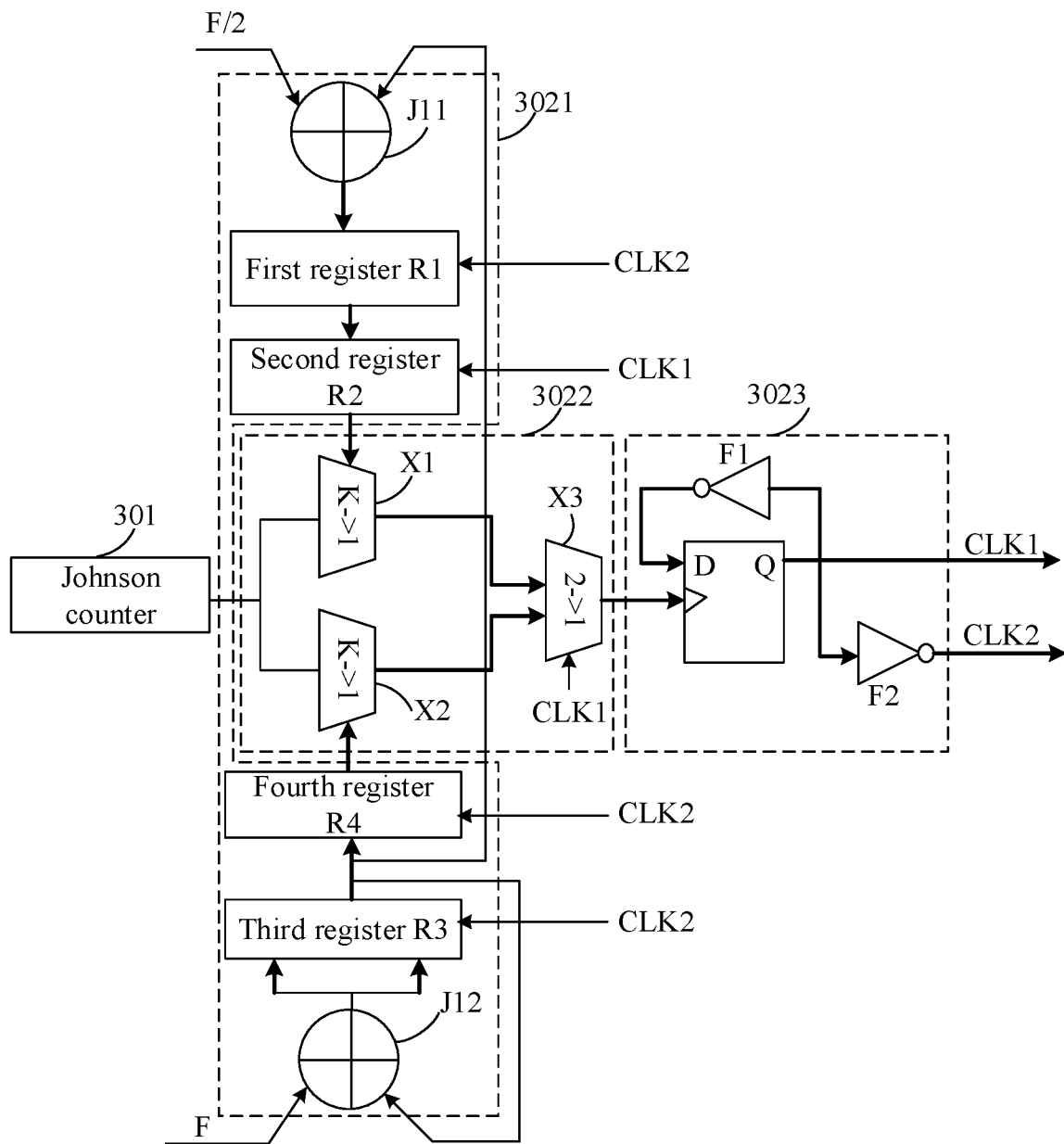
FIG. 9 is a schematic structural diagram of another target clock generating circuit according to an embodiment of the present disclosure.

FIG. 9 is a schematic structural diagram of sub-circuits in the target clock generating circuit 30 according to an embodiment of the present disclosure. As shown in FIG. 9, the input module 3021 may include: a first register R1, a second register R2, a third register R3, a fourth register R4 and two adders J11 and J12. The selection module 3022 may include: a first selector X1, a second selector X2 and a third selector X3. The output module 3023 may include a D flip-flop, a first inverter F1 and a second inverter F2.

The two adders J11 and J12 each may be respectively connected to the control word providing circuit 20 and the third register R3, the adder J11, the first register R1, the second register R2 and the first selector X1 are sequentially connected, and the other adder J12, the third register R3, the fourth register R4 and the second selector X2 are sequentially connected. For example, the two adders J11 and J12 shown in FIG. 9 are both connected to a connection line between the third register R3 and the fourth register R4.

The first selector X1 and the second selector X2 each may be further connected to the candidate clock generating sub-circuit 301 and the third selector X3, and the third selector X3 is further connected to a first input terminal of the D flip-flop.

A second input terminal of the D flip-flop is connected to an output terminal of the first inverter F1, an input terminal of the first inverter F1 and an input terminal of the second inverter F2 are both connected to an output terminal of the D flip-flop. It should be noted that, with reference to FIG. 9, the output terminal of the D flip-flop may be used as the output of a first clock signal terminal CLK1, the output terminal of the second inverter F2 may be used as the output of a second clock signal terminal CLK2, and the clock signal provided by the first clock signal terminal CLK1 and the second clock signal terminal CLK2 are only opposite in phase and have the same frequency.

For example, with reference to FIG. 7 and FIG. 9, assuming that the candidate clock generating sub-circuit 301 generates a total of K candidate clock signals, both the first selector X1 and the second selector X2 may be a K->1 selector shown in FIG. 9 (that is, one target candidate clock signal is selected from the K candidate clock signals). Because the third selector X3 is configured to select one from two, with reference to FIG. 9, the third selector X3 may be a 2->1 selector (that is, one target candidate clock signal is selected from two candidate clock signals).

With reference to FIG. 9, the principle of the target clock generating circuit 30 generating the target clock signal is described by using an example in which the second register R2 and the third selector X3 are connected to the first clock signal terminal CLK1, and the first register R1, the third register R3 and the fourth register R4 are all connected to the second clock signal terminal CLK2.

For example, the adder J11 may add a part of a value of the frequency control word F (for example, F/2 shown in FIG. 9) and the highest significant bit (for example, 5 bits) stored in the third register R3, and then store a summation result in the first register R1 on a rising edge of the second clock signal provided by the second clock signal terminal CLK2; or the adder J11 may add a part of a value of the frequency control word F and all information stored in the third register R3, and then store a summation result in the first register R1 on the rising edge of the second clock signal. On a rising edge of a next first clock signal, the highest significant bit stored in the first register R1 is stored in the second register R2 and used as a selection signal of the first selector X1. Accordingly, the first selector X1 may then select, in response to the selection signal, one target candidate clock signal from the K candidate clock signals as an output signal of the first selector X1, and output the output signal to the third selector X3.

Similarly, the other adder J12 may add a value of the frequency control word F and the highest significant bit stored in the third register R3, and then store a summation result in the third register R3 on the rising edge of the second clock signal CLK2. Alternatively, the other adder J12 may add a value of the frequency control word F and all information stored in the third register R3, and then store a summation result in the third register R3 on the rising edge of the second clock signal CLK2. On the rising edge of the next second clock signal, the highest significant bit stored in the third register R3 is stored in the fourth register R4 and used as a selection signal of the second selector X2. Accordingly, the second selector X2 may then select, in response to the selection signal, one target candidate clock signal from the K candidate clock signals as an output signal of the second selector X2, and output the output signal to the third selector X3.

Further, the third selector X3 may select one of the output signal of the first selector X1 and the output signal of the first selector X2 as an output signal of the third selector X3 on a rising edge of the first clock signal, and output the output signal to the D flip-flop to serve as an input clock signal of the D flip-flop. Then, a clock signal output from the output terminal of the D flip-flop and the output terminal of the second inverter F2 may be used as a final output signal, and thus, the target clock signal is generated.

Optionally, the selection signal output by the fourth register R4 may be used as a falling edge selection signal, the selection signal output by the second register R2 may be used as a rising edge selection signal, and the signal fed back by the third register R3 to the adder J12 may be used to control period switching of the generated clock. Correspondingly, the selection signal output by the fourth register R4 may be referred to as a falling edge control word, and the selection signal output by the second register R2 may be referred to as a rising edge control word.

It should be noted that the magnitude of the frequency control words output to the adders J11 and J12 may be flexibly set by the user based on the desired target output frequency of the target clock signal; or may be flexibly set by the TAF-DPS circuit based on the target output frequency of the target clock signal finally required to be generated, and the target output frequency may be input by the user into the TAF-DPS circuit.

Figure 10:
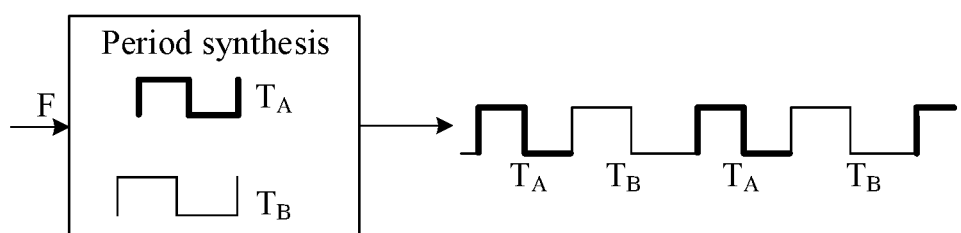
FIG. 10 is a schematic structural diagram of a working principle of target clock generating circuit according to an embodiment of the present disclosure.

It should also be noted that the target clock generating circuit 30 described in this embodiment of the present disclosure may be referred to as a Time-Average-Frequency Direct Period Synthesis (TAF-DPS) circuit. The operating principle of the TAF-DPS circuit may be implemented based on time-average frequency (TAF). An implementable process of acquiring the target output frequency based on the TAF method may be schematically described with reference to FIG. 10.

It is assumed that the frequency control word is F, the phase difference between any two adjacent candidate clock signals is Δ, and F=I+r1, wherein I represents the integer part and r1 represents the fractional part. Two time periods $T_A$ and $T_B$ may be output through the TAF method:

$$T_A = I*\Delta \qquad \text{formula (6)}$$

$$T_B = (I+1)*\Delta \qquad \text{formula (7)}$$

The two time periods may be synthesized through the "period synthesis" technology to acquire a clock signal whose period is the target period, and the target period $T_{TAF}$ may satisfy:

$$T_{TAF} = (1-r1)*T_A + r1*T_B \qquad \text{formula (8)}$$

After formula (6) and formula (7) are substituted into formula (8), it can be acquired:

$$T_{TAF} = (I+r1)*\Delta \qquad \text{formula (9)}$$

It can be learned from formula (9) that r1 can determine the occurrence probability of $T_B$, that is, the fractional part r1 of a value of the frequency control word F can determine the switching frequency between the periods $T_A$ and $T_B$. The frequency $f_{TAF}$ of the clock signal output by the TAF-DPS circuit may be further calculated based on formula (9):

$$f_{TAF} = 1/T_{TAF} = 1/[(I+r1)*\Delta] = 1/F*\Delta \qquad \text{formula (10)}$$

Δ calculated through formula (5) is substituted into formula (10) to acquire $f_{TAF} = (K*f)/F$.

$f_{TAF}$ is the target output frequency fs in the embodiments of the present disclosure. In addition, with reference to FIG. 9, the target output frequency fs may be the first clock signal or the second clock signal finally output by the TAF-DPS circuit.

The candidate clock generating sub-circuit 301 actually divides the initial frequency fc of the initial clock signal output by the initial clock providing circuit 10 into K candidate clock signals with the frequency f, that is, K*f is actually fc, to derive the target output frequency fs in formula (1): fs=$f_{TAF}$=fc/F.

The clock signal generation circuit described in the embodiments of the present disclosure has better reliability and safety, and low implementation cost, and therefore, can be reused in various types of electronic devices.

In conclusion, this embodiment of the present disclosure provides a clock signal generation circuit. Because the target output frequency of the clock signal finally generated by the clock signal generation circuit is positively correlated with the initial frequency and negatively correlated with a value of the frequency control word, when the initial frequency is affected by the target parameter and frequency offset occurs, the frequency control word may be flexibly generated based on the target frequency offset to achieve reliable compensation for the initial frequency. In this way, the frequency of the finally generated target clock signal is less affected by the target parameter. The clock signal generation circuit generates the clock signal with better reliability.

Figure 11:
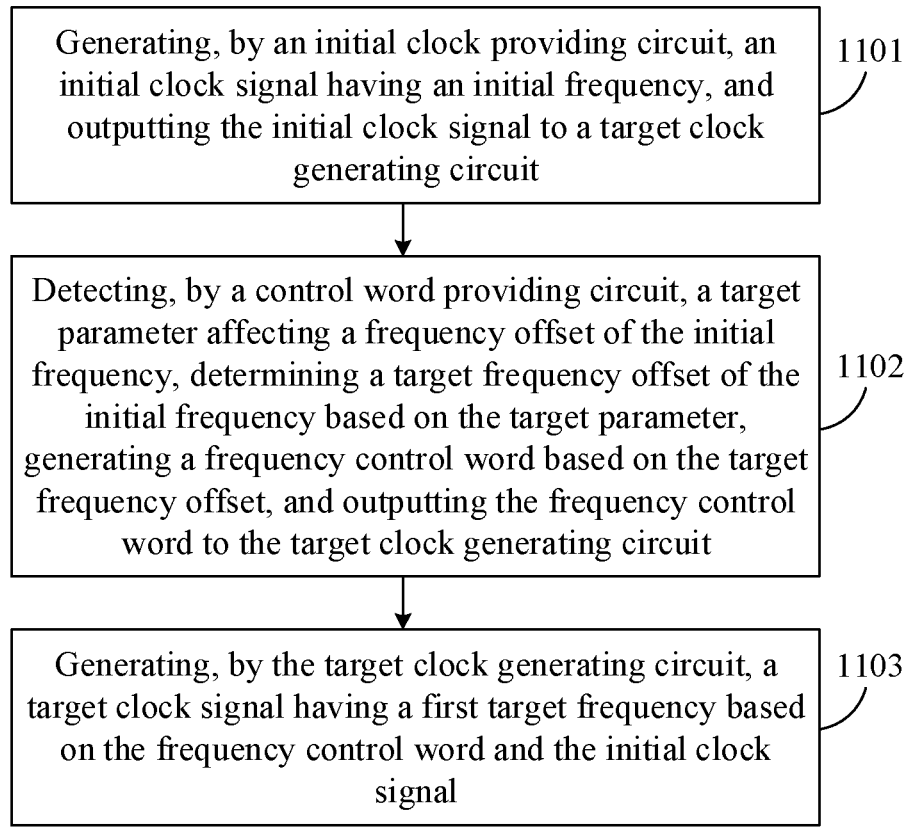
FIG. 11 is a flowchart of a method for generating a clock signal according to an embodiment of the present disclosure.

FIG. 11 is a method for generating a clock signal according to an embodiment of the present disclosure, which may be used in the clock signal generation circuit as shown in FIG. 1 or FIG. 2. As shown in FIG. 11, the method may include:

In step 1101, an initial clock providing circuit generates an initial clock signal having an initial frequency, and outputs the initial clock signal to a target clock generating circuit.

In step 1102, a control word providing circuit detects a target parameter affecting a frequency offset of the initial frequency, determines a target frequency offset of the initial frequency based on the target parameter, generates a frequency control word based on the target frequency offset, and outputs the frequency control word to the target clock generating circuit.

In step 1103, the target clock signal generation circuit generates a target clock signal having a target output frequency based on the frequency control word and the initial clock signal.

The target output frequency may be negatively correlated with a value of the frequency control word and positively correlated with the initial frequency.

In conclusion, this embodiment of the present disclosure provides a method for generating a clock signal. Because the target output frequency of the clock signal finally generated in the method for generating a clock signal is positively correlated with the initial frequency and negatively correlated with a value of the frequency control word, when the initial frequency is affected by the target parameter and frequency offset occurs, the frequency control word may be flexibly generated based on the target frequency offset to achieve reliable compensation for the initial frequency. In this way, the frequency of the finally generated target clock signal is less affected by the target parameter. The clock signal generation circuit generates the clock signal with better reliability.

It should be noted that for optional structures of circuits included in the clock signal generation circuit, and corresponding optional implementations of steps 1101 to 1103, refer to the above description on the device. Details are not repeated in the method embodiment.

Figure 12:
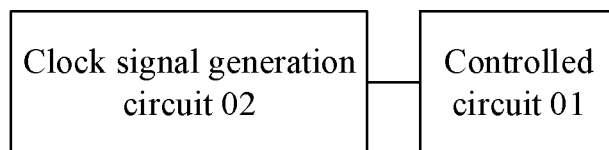
FIG. 12 is a schematic structural diagram of an electronic device according to an embodiment of the present disclosure.

In addition, FIG. 12 is a schematic structural diagram of an electronic device according to an embodiment of the present disclosure. As shown in FIG. 12, the electronic device includes: a controlled circuit 01 and the clock signal generation circuit 02 shown in FIG. 1 or FIG. 2.

The controlled circuit 01 may be connected to the clock signal generation circuit 02, and the controlled circuit 01 may be configured to operate in response to a target clock signal having a target output frequency output by the clock signal generation circuit 02.

Because the frequency of the clock signal output by the clock signal generation circuit 02 in this embodiment of the present disclosure is less or even not affected by the target parameter, operation safety and reliability of the target device are increased. Optionally, the electronic device may be a microcontroller, a mobile terminal or an embedded device.

It should be understood that the term "and/or" in this specification may indicates three types of relationships. For example, A and/or B may indicate that A exists alone, A and B coexist, or B exists alone. The character "/" generally indicates that the associated objects are in an "or" relationship.

A person skilled in the art can clearly understand that, for convenience and brevity of description, reference can be made to corresponding processes in the foregoing method embodiments for specific working processes of the above circuits, sub-circuits, modules and devices included in the clock signal generation circuit. Details are not described herein again.

The foregoing descriptions are merely optional embodiments of the present disclosure and are not intended to limit the present disclosure. Any modification, equivalent replacement, and improvement within the spirit and principle of the present disclosure shall be included within the protection scope of the present disclosure.

What is claimed is:

1. A clock signal generation circuit, comprising: an initial clock providing circuit, a control word providing circuit and a target clock generating circuit, wherein
the initial clock providing circuit is connected to the target clock generating circuit, and the initial clock providing circuit is configured to: generate an initial clock signal having an initial frequency, and output the initial clock signal to the target clock generating circuit;
the control word providing circuit is connected to the target clock generating circuit, and the control word providing circuit is configured to: detect a target parameter affecting a frequency offset of the initial frequency, determine a target frequency offset of the initial frequency based on the target parameter, generate a frequency control word based on the target frequency offset, and output the frequency control word to the target clock generating circuit; and
the target clock generating circuit is configured to generate a target clock signal having a target output frequency based on the frequency control word and the initial clock signal, wherein the target output frequency is negatively correlated with a value of the frequency control word and positively correlated with the initial frequency.

2. The clock signal generation circuit according to claim 1, wherein the target output frequency fs satisfies: fs=fc/F, wherein fc is the initial frequency and F is the value of the frequency control word.

3. The clock signal generation circuit according to claim 1, wherein the target parameter comprises a temperature, and the control word providing circuit comprises a temperature detecting sub-circuit, a frequency offset determining sub-circuit and a control word generating sub-circuit;
the temperature detecting sub-circuit is connected to the frequency offset determining sub-circuit, and the temperature detecting sub-circuit is configured to: detect a target temperature, and output the target temperature to the frequency offset determining sub-circuit;
the frequency offset determining sub-circuit is further connected to the control word generating sub-circuit, and the frequency offset determining sub-circuit is configured to: determine the target frequency offset of the initial frequency based on the target temperature, and output the target frequency offset to the control word generating sub-circuit; and
the control word generating sub-circuit is further connected to the target clock generating circuit, and the control word generating sub-circuit is configured to: generate the frequency control word based on the target frequency offset, a historical frequency control word and a reference output frequency, output the frequency control word to the target clock generating circuit, and update the historical frequency control word with the frequency control word, wherein
a value of the frequency control word F satisfies: $F=F0+\Delta f/fs'$, F0 is a value of the historical frequency control word, $\Delta f$ is the target frequency offset, and fs' is the reference output frequency.

4. The clock signal generation circuit according to claim 3, wherein the frequency offset determining sub-circuit comprises a controller and a memory, and the memory stores a plurality of candidate frequency offsets in a one-to-one correspondence with a plurality of different temperatures; and
the controller is respectively connected to the memory and the control word generating sub-circuit, and the controller is configured to: search for a target candidate frequency offset corresponding to the target temperature from the plurality of candidate frequency offsets stored in the memory, determine the target candidate frequency offset as the target frequency offset, and output the target frequency offset to the control word generating sub-circuit.

5. The clock signal generation circuit according to claim 4, wherein the memory has a plurality of storage areas, each of the storage areas stores one candidate frequency offset, and candidate frequency offsets stored in different storage areas are different; and
the controller is configured to: determine an address of a target storage area from the plurality of storage areas based on the target temperature, and acquire the target frequency offset from the target storage area based on the address of the target storage area, wherein the address A1 of the target storage area satisfies: A1=T/r+A0, A0 is a reference address, T is the target temperature, and r is a detection resolution of the temperature detecting sub-circuit.

6. The clock signal generation circuit according to claim 3, wherein the frequency offset determining sub-circuit is configured to determine a target frequency offset in each detection period based on the target temperature output by the temperature detecting sub-circuit; and the control word generating sub-circuit is further configured to: determine whether the target frequency offset is equal to a historical frequency offset, and generate the frequency control word based on the target frequency offset, the historical frequency control word and the reference output frequency if the target frequency offset is not equal to the historical frequency offset, wherein the historical frequency offset is a target frequency offset determined by the frequency offset determining sub-circuit in a previous detection period.

7. The clock signal generation circuit according to claim 6, wherein the control word generating sub-circuit comprises: a register, a comparator and a control word generating unit;

the register is respectively connected to the frequency offset determining sub-circuit, the comparator and the control word generating unit, and the register is configured to: output the historical frequency offset to the comparator, output the target frequency offset generated by the frequency offset determining sub-circuit to the control word generating unit, and update the historical frequency offset with the target frequency offset;

the comparator is further respectively connected to the frequency offset determining sub-circuit and the control word generating unit, and the comparator is configured to: determine whether the target frequency offset is equal to the historical frequency offset, and output an enable signal to the control word generating unit if the target frequency offset is not equal to the historical frequency offset; and the control word generating unit is further connected to the target clock generating circuit, and the control word generating unit is configured to: generate the frequency control word in response to the enable signal based on the target frequency offset, the historical frequency control word and the reference output frequency, output the frequency control word to the target clock generating circuit, and update the historical frequency control word with the frequency control word.

8. The clock signal generation circuit according to claim 7, wherein the target output frequency fs satisfies: fs=fc/F, wherein fc is the initial frequency and F is the value of the frequency control word;

the frequency offset determining sub-circuit comprises a controller and a memory, the memory has a plurality of storage areas, each of the storage areas stores one candidate frequency offset, and candidate frequency offsets stored in different storage areas are different;

the controller is respectively connected to the memory and the control word generating sub-circuit, and the controller is configured to: determine an address of a target storage area from the plurality of storage areas based on the target temperature, and acquire the target frequency offset from the target storage area based on the address of the target storage area, wherein the address A1 of the target storage area satisfies: A1=T/r+A0, A0 is a reference address, T is the target temperature, and r is a detection resolution of the temperature detecting sub-circuit;

the target clock generating circuit comprises: a Johnson counter, a first register, a second register, a third register, a fourth register, two adders, a first selector, a second selector, a third selector, a D flip-flop, a first inverter, and a second inverter;

each of the two adders is connected to the control word providing circuit, one of the adders, the first register, the second register and the first selector are sequentially connected, and the other adder, the third register, the fourth register and the second selector are sequentially connected;

each of the first selector and the second selector is further respectively connected to the candidate clock generating sub-circuit and the third selector, and the third selector is further connected to a first input terminal of the D flip-flop; and a second input terminal of the D flip-flop is connected to an output terminal of the first inverter, and an input terminal of the first inverter and an input terminal of the second inverter are both connected to an output terminal of the D flip-flop.

9. The clock signal generation circuit according to claim 1, wherein the target clock generating circuit comprises a candidate clock generating sub-circuit and a target clock generating sub-circuit;

the candidate clock generating sub-circuit is respectively connected to the initial clock providing circuit and the target clock generating sub-circuit, and the candidate clock generating sub-circuit is configured to: generate a plurality of candidate clock signals based on the initial clock signal output by the initial clock providing circuit, and output the plurality of candidate clock signals to the target clock generating sub-circuit, wherein each of the candidate clock signals has the same period, and a phase difference between any two adjacent candidate clock signals is the same; and the target clock generating sub-circuit is further connected to the control word providing circuit, and the target clock generating sub-circuit is configured to generate the target clock signal having the target output frequency based on the plurality of candidate clock signals and the frequency control word output by the control word providing circuit.

10. The clock signal generation circuit according to claim 9, wherein the target clock generating sub-circuit comprises: an input module, a selection module and an output module;

the input module is connected to the control word providing circuit, and the input module is configured to output a selection control signal to the selection module based on the frequency control word;

the selection module is further respectively connected to the candidate clock generating sub-circuit and the output module, and the selection module is configured to: select a target candidate clock signal from the plurality of candidate clock signals in response to the selection control signal, and output the target candidate clock signal to the output module; and the output module is configured to convert the target candidate clock signal to the target clock signal.

11. The clock signal generation circuit according to claim 10, wherein the input module comprises: a first register, a second register, a third register, a fourth register and two adders; the selection module comprises: a first selector, a second selector and a third selector; and the output module comprises: a D flip-flop, a first inverter and a second inverter;

each of the two adders is respectively connected to the control word providing circuit and the third register, one of the adders, the first register, the second register and the first selector are sequentially connected, and the other adder, the third register, the fourth register and the second selector are sequentially connected;

each of the first selector and the second selector is further respectively connected to the candidate clock generating sub-circuit and the third selector, and the third selector is further connected to a first input terminal of the D flip-flop; and a second input terminal of the D flip-flop is connected to an output terminal of the first inverter, and an input terminal of the first inverter and an input terminal of the second inverter are both connected to an output terminal of the D flip-flop.

12. A method for generating a clock signal, comprising:

generating, by an initial clock providing circuit, an initial clock signal having an initial frequency, and outputting the initial clock signal to a target clock generating circuit;

detecting, by a control word providing circuit, a target parameter affecting a frequency offset of the initial frequency, determining a target frequency offset of the initial frequency based on the target parameter, generating a frequency control word based on the target frequency offset, and outputting the frequency control word to the target clock generating circuit; and generating, by the target clock generating circuit, a target clock signal having a target output frequency based on the frequency control word and the initial clock signal, wherein the target output frequency is negatively correlated with a value of the frequency control word and positively correlated with the initial frequency.

13. The method according to claim 12, wherein the target parameter comprises a temperature; the control word providing circuit comprises a temperature detecting sub-circuit, a frequency offset determining sub-circuit and a control word generating sub-circuit; and detecting, by the control word providing circuit, the target parameter affecting the frequency offset of the initial frequency, determining the target frequency offset of the initial frequency based on the target parameter, and generating the frequency control word based on the target frequency offset comprises:

detecting, by the temperature detecting sub-circuit, a target temperature, and outputting the target temperature to the frequency offset determining sub-circuit;

determining, by the frequency offset determining sub-circuit, the target frequency offset of the initial frequency based on the target temperature, and outputting the target frequency offset to the control word generating sub-circuit; and generating, by the control word generating sub-circuit, the frequency control word based on the target frequency offset, a historical frequency control word and a reference output frequency, wherein a value of the frequency control word F satisfies: $F=F0+\Delta f/fs'$, F0 is a value of the historical frequency control word, $\Delta f$ is the target frequency offset, and fs' is the reference output frequency; and the method further comprises: updating, by the control word generating sub-circuit, the historical frequency control word with the frequency control word.

14. The method according to claim 13, wherein the frequency offset determining sub-circuit comprises a controller and a memory, and the memory stores a plurality of candidate frequency offsets in a one-to-one correspondence with a plurality of different temperatures; and determining, by the frequency offset determining sub-circuit, the target frequency offset of the initial frequency based on the target temperature comprises:

searching, by the controller, for a target candidate frequency offset corresponding to the target temperature from the plurality of candidate frequency offsets stored in the memory; and determining, by the controller, the target candidate frequency offset as the target frequency offset.

15. An electronic device, comprising a controlled circuit and a clock signal generation circuit, wherein the controlled circuit is connected to the clock signal generation circuit, and the controlled circuit is configured to operate in response to a target clock signal having a target output frequency output by the clock signal generation circuit; and the clock signal generation circuit comprises: an initial clock providing circuit, a control word providing circuit and a target clock generating circuit, wherein the initial clock providing circuit is connected to the target clock generating circuit, and the initial clock providing circuit is configured to: generate an initial clock signal having an initial frequency, and output the initial clock signal to the target clock generating circuit;

the control word providing circuit is connected to the target clock generating circuit, and the control word providing circuit is configured to: detect a target parameter affecting a frequency offset of the initial frequency, determine a target frequency offset of the initial frequency based on the target parameter, generate a frequency control word based on the target frequency offset, and output the frequency control word to the target clock generating circuit; and the target clock generating circuit is configured to generate a target clock signal having a target output frequency based on the frequency control word and the initial clock signal, wherein the target output frequency is negatively correlated with a value of the frequency control word and positively correlated with the initial frequency.

16. The electronic device according to claim 15, wherein the target output frequency fs satisfies: $fs=fc/F$, wherein fc is the initial frequency and F is the value of the frequency control word.

17. The electronic device according to claim 15, wherein the target parameter comprises a temperature, and the control word providing circuit comprises a temperature detecting sub-circuit, a frequency offset determining sub-circuit and a control word generating sub-circuit;

the temperature detecting sub-circuit is connected to the frequency offset determining sub-circuit, and the temperature detecting sub-circuit is configured to: detect a target temperature, and output the target temperature to the frequency offset determining sub-circuit;

the frequency offset determining sub-circuit is further connected to the control word generating sub-circuit, and the frequency offset determining sub-circuit is configured to: determine the target frequency offset of the initial frequency based on the target temperature, and output the target frequency offset to the control word generating sub-circuit; and the control word generating sub-circuit is further connected to the target clock generating circuit, and the control word generating sub-circuit is configured to: generate the frequency control word based on the target frequency offset, a historical frequency control word and a reference output frequency, output the frequency control word to the target clock generating circuit, and update the historical frequency control word with the frequency control word, wherein a value of the frequency control word F satisfies: $F=F0+\Delta f/fs'$, F0 is a value of the historical frequency control word, $\Delta f$ is the target frequency offset, and fs' is the reference output frequency.

18. The electronic device according to claim 17, wherein the frequency offset determining sub-circuit comprises a controller and a memory, and the memory stores a plurality of candidate frequency offsets in a one-to-one correspondence with a plurality of different temperatures; and the controller is respectively connected to the memory and the control word generating sub-circuit, and the controller is configured to: search for a target candidate frequency offset corresponding to the target temperature from the plurality of candidate frequency offsets stored in the memory, determine the target candidate frequency offset as the target frequency offset, and output the target frequency offset to the control word generating sub-circuit.

19. The electronic device according to claim 18, wherein the memory has a plurality of storage areas, each of the storage areas stores one candidate frequency offset, and candidate frequency offsets stored in different storage areas are different; and the controller is configured to: determine an address of a target storage area from the plurality of storage areas based on the target temperature, and acquire the target frequency offset from the target storage area based on the address of the target storage area, wherein the address A1 of the target storage area satisfies: $A1=T/r+A0$, A0 is a reference address, T is the target temperature, and r is a detection resolution of the temperature detecting sub-circuit.

20. The electronic device according to claim 17, wherein the frequency offset determining sub-circuit is configured to determine a target frequency offset in each detection period based on the target temperature output by the temperature detecting sub-circuit; and the control word generating sub-circuit is further configured to: determine whether the target frequency offset is equal to a historical frequency offset, and generate the frequency control word based on the target frequency offset, the historical frequency control word and the reference output frequency if the target frequency offset is not equal to the historical frequency offset, wherein the historical frequency offset is a target frequency offset determined by the frequency offset determining sub-circuit in a previous detection period.

* * * * *